United States Patent [19]
Lancaster

[11] Patent Number: 6,137,720
[45] Date of Patent: Oct. 24, 2000

[54] SEMICONDUCTOR REFERENCE VOLTAGE GENERATOR HAVING A NON-VOLATILE MEMORY STRUCTURE

[75] Inventor: Loren T. Lancaster, Colorado Springs, Colo.

[73] Assignee: Cypress Semiconductor Corporation, San Jose, Calif.

[21] Appl. No.: 09/198,747

[22] Filed: Nov. 24, 1998

Related U.S. Application Data

[60] Provisional application No. 60/066,533, Nov. 26, 1997.

[51] Int. Cl.[7] ................................................. G11C 16/04
[52] U.S. Cl. ................................ 365/185.11; 365/185.2
[58] Field of Search .......................... 365/185.11, 185.17, 365/185.2, 185.25, 185.29, 218

[56] References Cited

U.S. PATENT DOCUMENTS

| | | | |
|---|---|---|---|
| 4,648,074 | 3/1987 | Pollachek | 365/210 |
| 4,677,590 | 6/1987 | Arakawa | 365/210 |
| 4,799,195 | 1/1989 | Iwahashi et al. | 365/210 |
| 5,031,148 | 7/1991 | Kitazawa et al. | 365/185.21 |
| 5,109,187 | 4/1992 | Guliani | 365/226 |
| 5,117,392 | 5/1992 | Harada | 365/185.21 |
| 5,521,864 | 5/1996 | Kobayashi et al. | 365/185.25 |
| 5,524,094 | 6/1996 | Nobukata et al. | 365/185.21 |
| 5,644,533 | 7/1997 | Lancaster et al. | 365/185.18 |
| 5,748,536 | 5/1998 | Kwon et al. | 365/185.25 |
| 5,789,776 | 8/1998 | Lancaster et al. | 257/296 |

FOREIGN PATENT DOCUMENTS

WO 97/15929  5/1997  WIPO.

OTHER PUBLICATIONS

D.J. Hamilton, W.G. Howard, McGraw–Hill Book Company. Basic Integrated Circuit Engineering. ISBN 0–07–025763–9. 1975.

J. Millman, C. Halkias, McGraw–Hill Book Company. Integrated Electronics.ISBN 07–042316–6. 1972.

*Primary Examiner*—Trong Phan
*Attorney, Agent, or Firm*—Bradley T. Sako

[57] ABSTRACT

A non-volatile semiconductor reference voltage source has a memory unit capable of storing information about a history of an associated circuit. The memory unit is located in proximity to the memory unit and contains at least some similar elements as the memory unit. The history may include information about at least some of the following: states of stored information, construction variations of the elements of the associated circuit, environmental considerations, deterioration and fatigue of the elements, and decay of information in the associated circuit. The memory unit is connected to modify an output of the reference voltage source in accordance with the stored information. A method is also presented for generating a reference voltage within an integrated memory circuit. The method includes providing a column of said memory units, each memory unit having a unique row line set associated with it. A low-side line of said additional column is isolated from substantial current sources or current sinks, and the low-side line of said additional column is charged to said reference voltage. The voltage on said low-side line of said additional column is provided to an output node when said charging is substantially complete.

52 Claims, 8 Drawing Sheets

PRIOR ART

RESISTOR RATIO
PRIOR ART
FIG. 7A

FORWARD DIODE VOLTAGE
PRIOR ART
FIG. 7B

ZENER DIODE VOLTAGE
PRIOR ART
FIG. 7C

TRANSISTOR VOLTAGE DIVIDER
PRIOR ART
FIG. 7D

FIG. 13

SEMICONDUCTOR REFERENCE VOLTAGE GENERATOR HAVING A NON-VOLATILE MEMORY STRUCTURE

CROSS REFERENCES TO RELATED APPLICATIONS

This application claims priority from copending provisional patent application Ser. No. 60/066,533, filed Nov. 26, 1997.

BACKGROUND OF THE INVENTION

1. Field of the Invention

The present invention relates to improvements in a semiconductor reference voltage generators and, more particularly, to improvements in reference voltage generators used in electrically erasable, electrically programmable, read-only memories.

2. Description of the Related Art

Recently, a new type single-transistor non-volatile memory cell device has been proposed that uses a biased reference potential, one that is different from the system ground, to minimize disturbs and column leakage during read operations. Higher storage capacity and lower costs are achieved by utilizing a smaller memory cell of the type having a single memory transistor which shares its source and drain nodes with adjacent memory cells within a column. Several such cells are grouped together to form either a NAND array, a NOR array, or an AND array, with means to connect separate points within the array to bit lines and to the generated reference potential.

Figure 1:
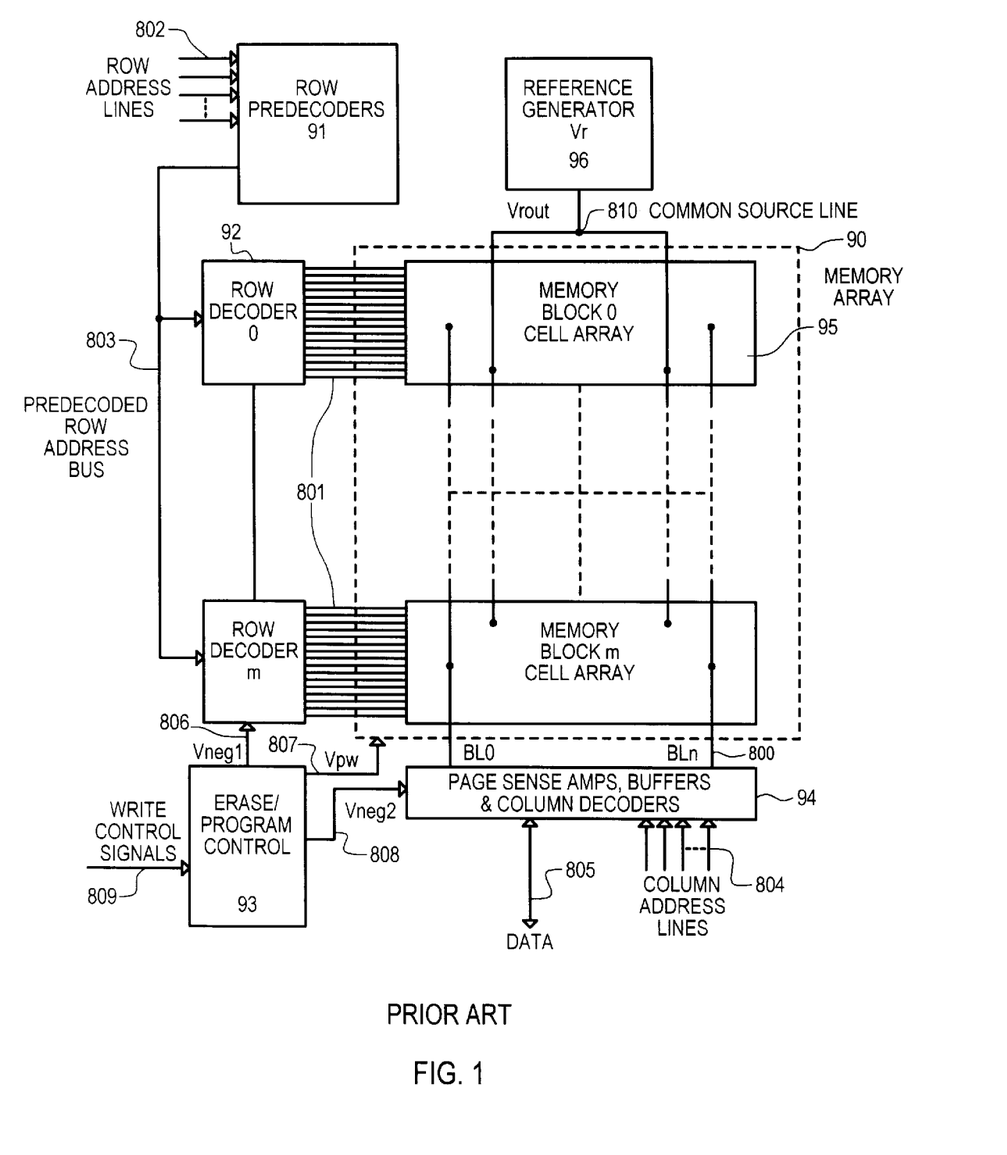
FIG. 1 shows a schematic block diagram of an overall circuit arrangement of a non-volatile memory device according to the prior art, wherein the internally generated reference potential is applied directly to nodes within the memory cell array.

FIG. 1 shows a non-volatile memory device according to prior art that applies the reference potential directly to nodes within the memory cell array. It includes at least one block 95, blocks 0 through m being shown. Each block 95 contains an array of addressable single transistor memory cells. Two embodiments of the array of memory cells within the blocks 95 in FIG. 1 are described below. Associated with each block 95 are the row decoders 92 that drive lines 801, which span the width of the blocks 95. The use of these lines 801 within block 95 is described in greater detail below. The blocks 95 are linked together by the bit lines 800 that also go to the page sense amplifiers, buffers and column decoders 94. Further, blocks 95 are linked together in common by common source line (CSL) 810 which forms a common reference node whose voltage is generated and controlled by reference generator 96. Reference generator 96 is required since the voltage on the CSL is not equal to ground potential during read modes as will be described in detail later.

Predecoded row address selection information is supplied to row decoders 92 by the row predecoders 91 by way of the predecoded row address bus 803. Row address lines 802 supply row input address information to row predecoders 91 and likewise column address lines 804 provide column input address information to column decoders included in 94. An erase/program control unit 93 is included which is controlled by write control lines 809 to supply Vneg1 806 to the row decoders 92, Vneg2 808 to the page sense amps, buffers and column decoders unit 94, and Vpw 807 to the memory array 90. Data input and output is performed by way of data line 805.

Figure 2:
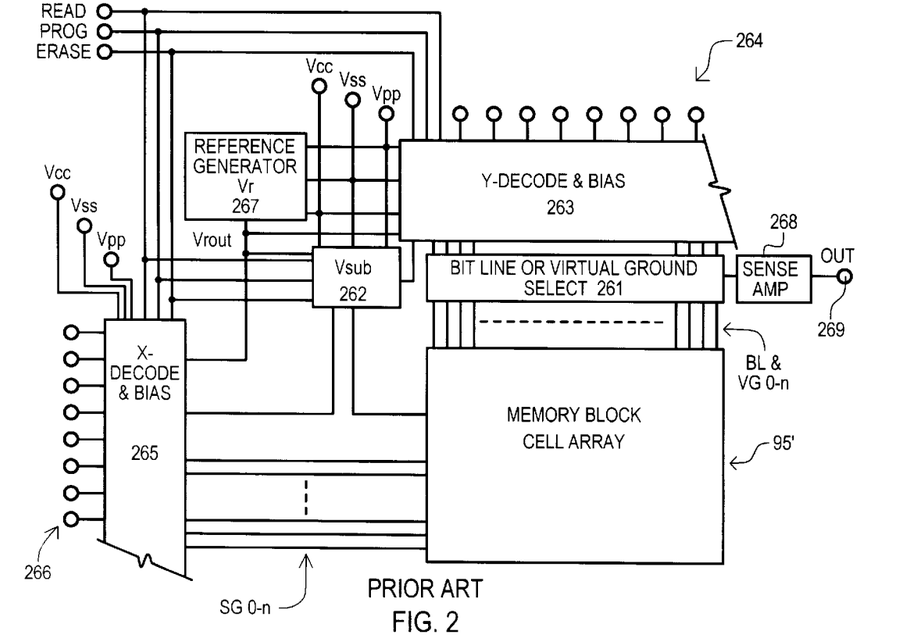
FIG. 2 shows a schematic block diagram of an overall circuit arrangement of another non-volatile memory device according to the prior art wherein the internally generated reference potential is applied to nodes within the memory cell array by way of a decoded path.

FIG. 2 shows a second non-volatile memory device according to prior art that applies the reference potential to nodes within the array by way of a decoded path. Non-volatile memory cells are arranged in a plurality of columns and rows of identical cells to form a cell array 95'. Two embodiments of the array of memory cells within the block 95' in FIG. 2 are described below.

As schematically shown in FIG. 2, the output, Vrout, of the reference generator 267 is connected through select circuits 261 and 263 to virtual ground lines and bit lines, designated as VG and BL respectively. The bit lines BL0, BL1, . . . BLn, and virtual ground lines VG0, VG1, . . . VGn, of the array are addressed by signals from a Y-decoder 263, which decodes address signals applied to an input address bus 264. The current produced on the bit lines BL0, BL1, . . . BLn during a read operation is sensed by a sense amplifier 268 for delivery to an output terminal 269, while the virtual ground lines VG0, VG1, . . . VGn are held at the on-chip generated reference potential, Vr, from reference generator 267.

In like manner, the gate lines SG0, SG1, . . . SGn are addressed by signals from an X-decoder 265, which decodes address signals applied to an input address bus 266. The X- and Y-decoders 265 and 263 each receive a on-chip generated reference voltage, Vr, from reference voltage generator 267, a supply voltage Vcc, a supply reference potential Vss, and a programming voltage Vpp for selective application to the respective bit, virtual ground, gate lines, and substrate of the array 95', as well as read, erase, and program control signals to specify the particular function to be performed and voltage levels to be selected and applied.

The construction of the reference voltage generator 96 in FIG. 1 and 267 in FIG. 2 has been previously described as a voltage divider, band gap, or other similar circuit. A new type of reference voltage generator is the subject of this invention.

Figure 3:
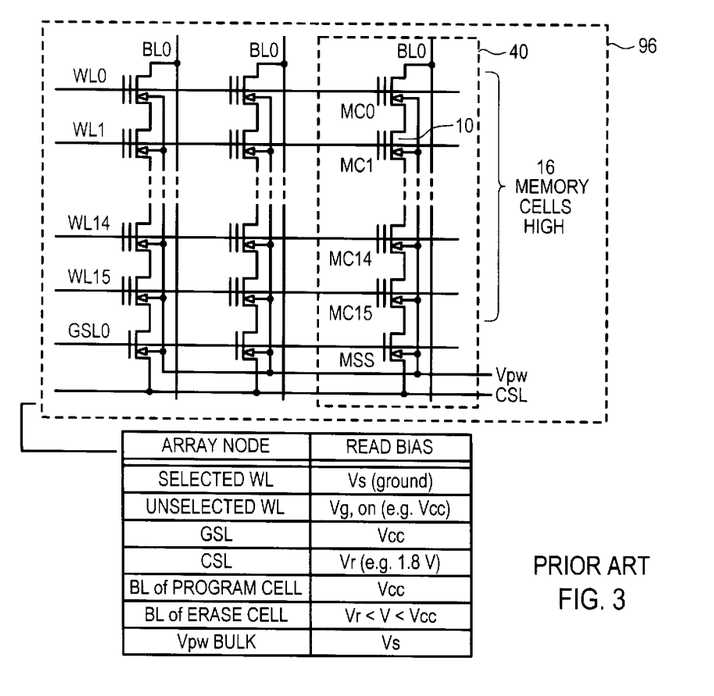
FIG. 3 is an electrical schematic diagram showing the internal circuit arrangement of a NAND configured non-volatile memory according to the prior art and an associated table showing example biases applied to the NAND stack during a read operation.

FIG. 3 shows a NAND cell array 96 according to the prior art that can be placed within memory block 95 in FIG. 1 or memory block 95' of FIG. 2. Read biases for block 96 are shown in the associated table. Block 96 includes (n+1) copies of the NAND stack 40, each of which is connected at the top to one of (n+1) bit lines, BL0, BL1, through BLn and connected on the bottom to the common source line CSL. Further, the entire block 96 resides within a common well connected to Vpw. In FIG. 3 sixteen non-volatile memory transistors 10, labeled MC0, MC1, through MC15, are shown in each NAND stack 40.

The gates of transistors MC0, MC1, through MC15 are connected in common with gates of adjacent NAND stacks within block 96 by way of word lines WL0, WL1, through WL15, respectively. Except for memory transistors MC0 and MC15, the drain and source of adjacent memory cells within the NAND stack 40 are connected together. The source of memory transistor MC0 is connected to the drain of the next memory cell down, memory transistor MC1. Also, the drain of memory transistor MC0 is connected to a bit line (BL). The drain of memory transistor MC15 is connected to the source of the next memory cell above, memory transistor MC14. Also, the source of memory transistor MC15 is connected to the drain of select transistor MSS and the source of select transistor MSS is connected to the common reference line (CSL), which is typically a diffusion. The NAND stack 40 also includes a selection transistor MSS whose gate is connected in common with adjacent NAND stacks within block 96 by way of the global select line, GSL0.

Figure 4:
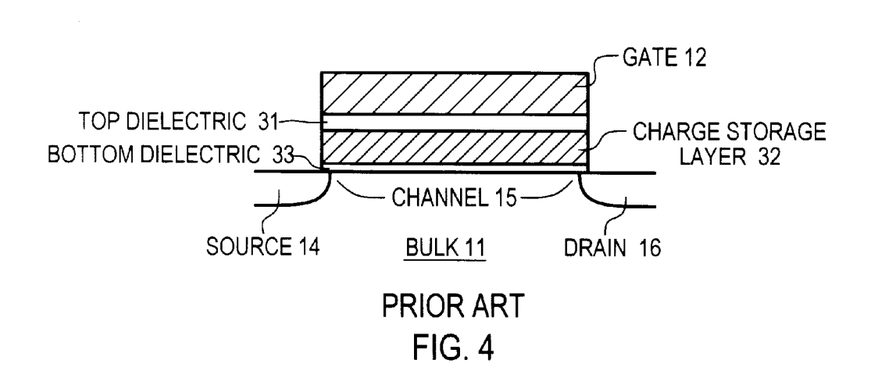
FIG. 4 shows a cross sectional view of a non-volatile memory transistor according to the prior art.

Memory transistor 10 is an insulated gate field effect transistor that includes a charge storage layer 32 embedded in its gate dielectric, as shown in FIG. 4. The charge storage layer 32 is typically surrounded by at least a top dielectric 31 and a bottom dielectric 33 and resides between the gate 12 and the channel 15 of the transistor. Channel 15 resides in the silicon bulk 11 between the source 14 and drain 16 regions. The charge storage layer 32 is either a "floating gate" of conductive material, typically of doped polycrystalline silicon, or a dielectric material such as silicon nitride, silicon oxynitride, silicon-rich silicon dioxide, or a ferroelectric material.

The amount and polarity of charge residing in the charge storage layer strongly affects the conductivity of the transistor 10. The words "programmed" and "erased" are used to describe two possible conductivity states that a transistor can achieve under two different charge storage conditions. It is recognized that the designation of the words "programmed" and "erased" is purely arbitrary and that these terms are selected to represent opposite meanings depending on the application. Here the terms are consistently used in reference to the relative levels of conductance. Thus the terms "erased" and "programmed" are used to describe the "on" and "off" states, respectively. The primary difference between these two states is the level of conductance in transistor 10 while under read biases. An "on" state results when the transistor 10 is conductive and an "off" state results when the transistor 10 is non-conductive, or at least is less conductive than a predetermined range of conductance that represents the "on" state.

Referring additionally to the table in FIG. 3, the NAND stack utilizes a read bias scheme in which Vr is supplied to the source side of the NAND stack by way of CSL. Gates of unselected memory cells are placed at Vg,on which is at least equal in magnitude to the magnitude of Vr plus the maximum program state threshold voltage (Vr+Vtpmax). The selected memory cell gate is biased at the well potential, in this case Vs=ground.

With the gate of the selected memory cell at 0 volts and the program threshold voltage negative, the common reference line, CSL, needs to be biased above the gate potential to turn off a selected cell when it is programmed. The voltage relative to the well on the common reference line, CSL, necessary to turn off selected programmed memory cells is Vr, and is described by |Vtpmin|<Vr<|Vtemax|. With the values of Vtpmin=−1.5 volts and Vtemax=−2.0 volts, the value of Vr could be 1.8 volts.

More specifically, when reading the state of transistor MC1, word line WL1 is placed at the well potential, in this case Vs=ground, while all other word lines are at Vg,on, in this case chosen to be Vcc, rendering them conductive. Further, common reference line, CSL, is at Vr=1.8 volts and the bit line potential on BL0 is placed at Vcc. If memory transistor MC1 is erased with a depletion threshold voltage of magnitude greater than Vr, memory transistor MC1 will be conductive, allowing current flow through the NAND stack. The potential of the bit line, BL, will fall from Vcc toward Vr. If memory transistor MC1 is programmed with a depletion threshold voltage of magnitude less than Vr, memory transistor MC1 will be non-conductive, impeding current flow through the NAND stack. The potential of the bit line, BL, will remain equal or nearly equal to Vcc. The state of the selected cell is determined by sensing the voltage on the bit line, BL, using conventional sensing means.

Figure 5:
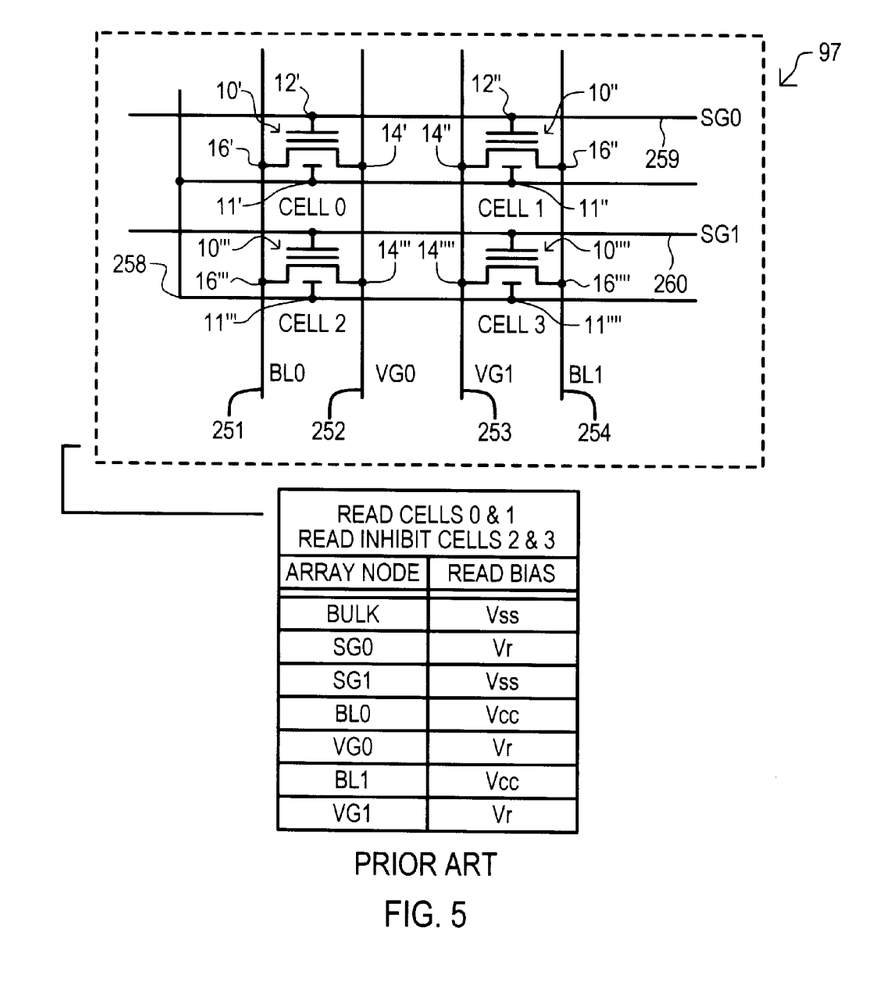
FIG. 5 is an electrical schematic diagram showing an internal circuit arrangement of a NOR configured non-volatile memory according to the prior art and an associated table showing example biases applied to the NOR stack during a read operation.

FIG. 5 shows a NOR cell array 97 according to the prior art which can be placed within memory block 95 in FIG. 1 or memory block 95' of FIG. 2. Read biases for block 97 are shown in the associated table. As schematically shown in FIG. 5, the block 97 includes an array of memory cells 10 as shown in FIG. 4. The cells 10' and 10''' are connected at the source nodes 14' and 14''' to the virtual ground line 252, designated as VG0, and the source nodes 14'' and 14'''' of cells 10'' and 10'''' are connected to the virtual ground line 253, designated as VG1. Likewise, the drain nodes 16' and 16''' of the cells 10' and 10''' are connected the bit line 251, designated as BL0, and the drain nodes 16'' and 16'''' of the cells 10'' and 10'''' are connected to bit line 254, designated as BL1.

The cells 10' and 10'' share a common gate line 259 (SG0), and cells 10''' and 10'''' share a common gate line 260 (SG1). Simply stated, the drain nodes 16 and source nodes 14 are "shared" among the cells 10 in columns and the gate nodes 12 are "shared" among the cells 10 in rows. Since the source nodes 14 and drain nodes 16 are not "shared" among cells 10 in any row, independent control of source lines is possible, permitting unaddressed cells to be actively deselected for elimination of high currents and "disturbed" cells.

On the other hand, cells 10 with "shared" or common drain nodes 16 and source nodes 14 have separates gate nodes 12 permitting a single addressed cell 10 to be read. Of course, an entire row of cells 10 can be read if desired.

Referring additionally to the table included in FIG. 5, the cell array 97 can be read by sensing a current on the bit lines 251, 254 or the virtual ground lines 252, 253 by known sensing techniques.

A cell 10 is read by the application of a voltage difference between the drain 16 and source 14, while the gate 12 is biased positive with respect to the bulk node 11 (or P-well) by an amount $V_r$, with the gate-to-source potential difference remaining zero. An erased device has a negative threshold voltage, so when its gate and source potential are equal at $V_r$, the erased device will be "on" and conducting current. A programmed device has a positive threshold voltage, so when its gate and source potential are equal at $V_r$, the programmed device will be "off" and non-conducting. The logic state of the cell 10 may be determined by using known sensing circuitry to measure the channel current of cell 10 under the bias conditions described in the prior sentence.

More specifically, when reading cells 0 and 1 in NOR cell array 97, the bulk is biased to the supply reference potential, Vss. The supply voltage, Vcc, is applied to the bitlines BL0 and BL1, while the on-chip generated reference potential, Vr, is applied to the virtual ground lines, VG0 and VG1. The gate of selected cells 0 and 1, SG0, is placed at Vr and the gate of unselected cells 2 and 3, SG1, is placed at Vss. With the gate to source voltage at zero on selected cells 0 and 1, current is expected to flow through these devices if they are erased. Since the voltage difference between the gate and source of the unselected cells 2 and 3 is negative by and amount Vr, the unselected cells will conduct little or no current compared to the erase current expected to flow in cells 0 and 1. The selection of the value of Vr is determined by the total current flow expected through the unselected cells. Vr must be sufficiently large to make this "leakage" current much less than the "on" current of erased selected cells.

One of the advantages provided by this circuit is that the value of $V_r$ is less than $V_{cc}$. It has been found that by using gate selection on a cell by bringing the source potential up from the potential of the substrate to a value $V_r$, the device can be deselected by bringing the gate potential from $V_r$ to $V_{ss}$, thereby turning off the source junction, and, consequently, creating no fields between the gate the substrate that may cause a disturb condition. The purpose of $V_r$ is also to allow the method or system of reading individual cells in a cell array without causing a disturb to the cells of the array, and particularly to the addressed cell(s).

The upper limit of the magnitude of the value of $V_r$ should be selected to be less than $V_{cc}$, and preferably less than $V_{cc}-V_{ds,sat}$, where $V_{ds,sat}$ is the saturation voltage of the device. Since the voltage on the drain of a cell being read is $V_{cc}$, the value of $V_r$ on the source and gate should be selected to still enable sufficient current to flow to be detectable. Moreover, the erase threshold can change with age (typically becoming less negative). Cells which have been cycled a large number of times or which contain older data produce different (typically less) current levels when addressed compared to uncycled cells containing freshly written data. Thus, the upper limit that can be selected for $V_r$ needs to take both beginning-of-life and end-of-life current levels into consideration. Preferably, $V_r$ should be selected to be as close to the magnitude of the threshold of an erased cell as possible, allowing sufficient current to flow for reliable sensing under end of life conditions.

In prior art, the reference generator, which produces Vr, has typically been of the type that does not take into account the changes in erased threshold voltage as a function of time or use. Typically, the reference generator produces a voltage that is derived from a reference source and the output of the reference voltage generator is controlled through a negative feedback system.

Figure 6:
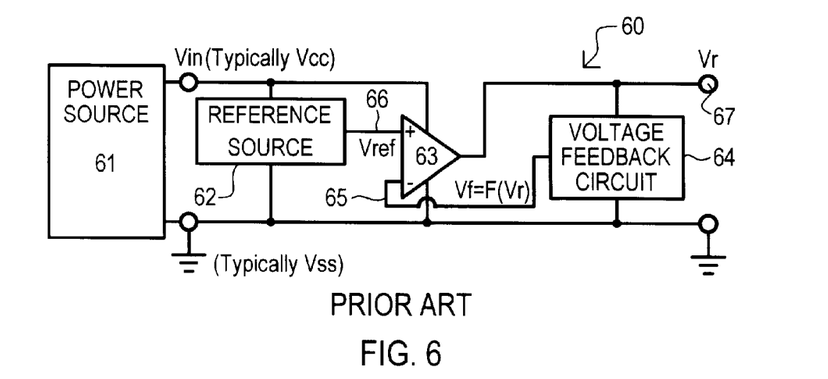
FIG. 6 is an electrical schematic diagram showing a typical reference voltage generator circuit according to the prior art.

FIG. 6 shows a schematic of a typical reference voltage generator 60. A power source 61 supplies power at a voltage higher than the reference voltage, Vr, to be produced at node 67. Within an integrated circuit, the power supply typically provides Vcc and the power source reference potential, typically Vss. A reference source 62 generates Vref on node 66, which is provided to the non-inverting input of a differential amplifier 63. Amplifier 63 produces Vr at its output and provides current gain to drive the reference generator output 67. Negative feedback of the output voltage, Vr, is provided by a voltage feedback circuit 64, the output of which is supplied to the inverting input of differential amplifier 63 at node 65. Voltage feedback circuit 64 generates an output, Vf, which is a function of Vr, typically a fixed offset from Vr, a ratio multiplied by Vr or some combination of both. The negative feedback serves to drive the output of amplifier 63 to Vr when Vf is equal or nearly equal to Vref. One aspect of this invention is to provide a new and improved circuit for the reference source 62 that is useful for the memory circuit applications shown in FIG. 1 and FIG. 2 above.

Figures 7A, 7B:
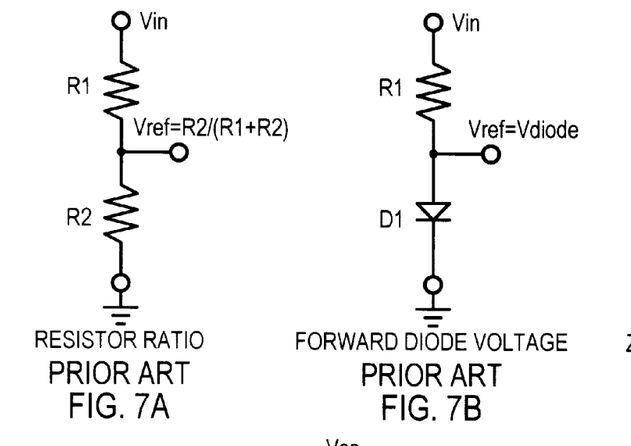
FIG. 7 is an electrical schematic diagram showing the internal circuit arrangement of four reference voltage sources that can be incorporated in the circuit of FIG. 6 according to the prior art.
Figure 7C:
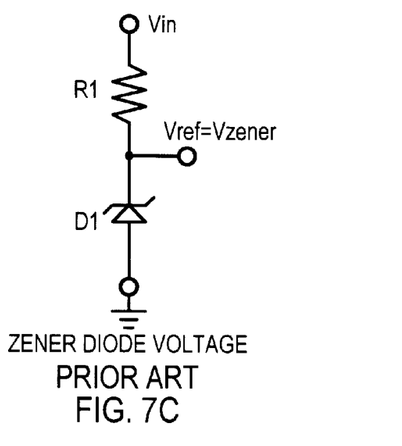
Figure 7D:
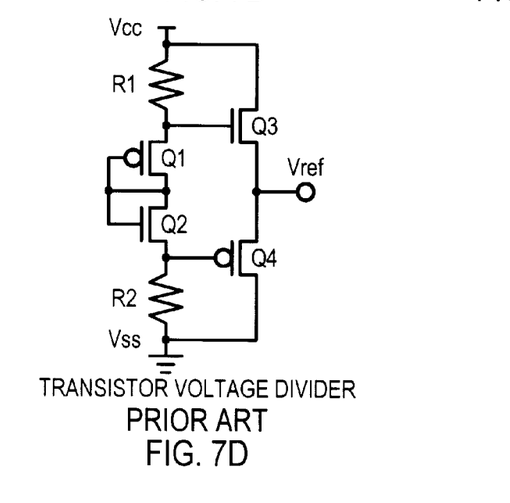

Examples of prior art reference source circuits are resistor or capacitor voltage dividers, biased diode dividers such as used in band gap references or Zener diode reference circuits, as shown in FIG. 7. Another example shown in FIG. 7 is a transistor-based, push-pull amplifier-like, reference voltage generator as used in DRAM products.

All such voltage reference sources are typically designed to provide a fixed voltage output which, when placed in a reference generator circuit such as the one shown in FIG. 5, is insensitive to natural variations in temperature, power-source voltage, device geometry, current load on the output, and others. This is a suitable design criterion when the operation of the device for which the reference voltage is supplied operates best when the voltage is independent of these expected variations.

However, this criterion is not proper for the reference voltage needs described above for the non-volatile memory arrays in FIG. 3 and FIG. 5. In particular, it is desirable for optimal operation of the arrays shown in FIG. 3 and FIG. 5 to change the reference voltage with variations, rather than hold it fixed. This criterion is best understood by examining the use of Vr during the read operations of the arrays in FIG. 3 and FIG. 5.

A primary objective in placing Vr on the source side of the memory array transistors in FIG. 3 and FIG. 5 is to ensure that the devices which are expected to turn off during a read operation will be sufficiently non-conductive when their gate voltage is set to the well potential (typically Vss). These "off" devices must conduct little or no current in comparison to those devices that are expected to turn "on" in order to accurately determine the logic state of selected devices throughout a wide range of operating conditions.

In the case of the array shown in FIG. 3, Vr must be sufficient enough to ensure that the selected device, the gate of which is set to the well potential, is in a low conductance state, passing little or no current, when in the program state. Likewise, for the array shown in FIG. 5, Vr must be sufficient enough to ensure that the deselected devices, the gate of which are set to the well potential, are in the low conductance state, passing little or no current during a read operation.

The conductivity a non-volatile memory transistor under a fixed bias condition depends on a number of parameters. These include the transistor channel length and width, the transistor temperature, the doping in the transistor channel, the dielectric thickness between the channel and the gate, the amount of charge stored in the charge storage element, the effects of repeatedly cycling the transistor from one state to another, and others. Further, the output of a voltage generator tends to vary with several of these parameters, and often times does so independently of variations in the non-volatile memory transistor conductivity.

In order to achieve and maintain consistent performance independent of these variations, the reference potential, Vr, must be generated in a way that it ensures a maximum "off" current regardless of variations in the parameters that affect the non-volatile memory transistor conductivity. Since the reference voltage generator is typically designed to provide a constant voltage output, extra margins are typically included in the selection of Vr in order to accommodate expected variations in operating conditions and transistor structure. Alternately, it is desirable to generate Vr using a reference source that tracks these variations rather than not, ensuring a constant "off" current, rather than a constant voltage, under all expected variations.

By using a reference source that tracks variations that affect non-volatile memory transistor conductivity, there is little or no need to select and control Vr in a manner that incorporates extra margins. Eliminating extra margins in Vr positively affects performance of devices shown in FIG. 1 and FIG. 2. As Vr decreases in magnitude, the drive current on devices that are in the "on" state increases. Thus, it is desirable to provide a reference source that is set to just eliminate conduction in "off" devices, and which tracks variations in order to ensure that such devices remain off under all expected operating conditions and variations.

Therefore, without further innovation the low cost advantages of the single transistor memory cell devices described above cannot be fully realized without a reference voltage generator that tracks variations in the construction, history and operation of the non-volatile transistors within the memory array.

SUMMARY OF THE INVENTION

In light of the above, therefore, it is an object of the invention to provide an improved non-volatile semiconductor memory device that provides better data storage reliability compared to prior art devices by eliminating the need for extra margins.

Another object of the invention is to provide an improved non-volatile semiconductor memory device that can be written a substantially higher number of times compared to prior art devices by internally tracking effects of cycling.

It is further an object of the invention to provide an improved non-volatile semiconductor memory device that achieves better read performance by maximizing sensing currents during a read operation.

It is yet another object of the invention to provide an improved non-volatile semiconductor memory device that provides higher manufacturability by internally tracking the effects of geometry variations on memory transistors.

The above and further objects, details and advantages of the invention will become apparent from the detailed description of the preferred embodiments presented hereinafter, when read in conjunction with the accompanying drawings.

BRIEF DESCRIPTION OF THE DRAWINGS

In the detailed description of preferred embodiments of the invention presented below, reference is made to the accompanying drawings of which.

DETAILED DESCRIPTION OF THE PREFERRED EMBODIMENTS

Figure 8:
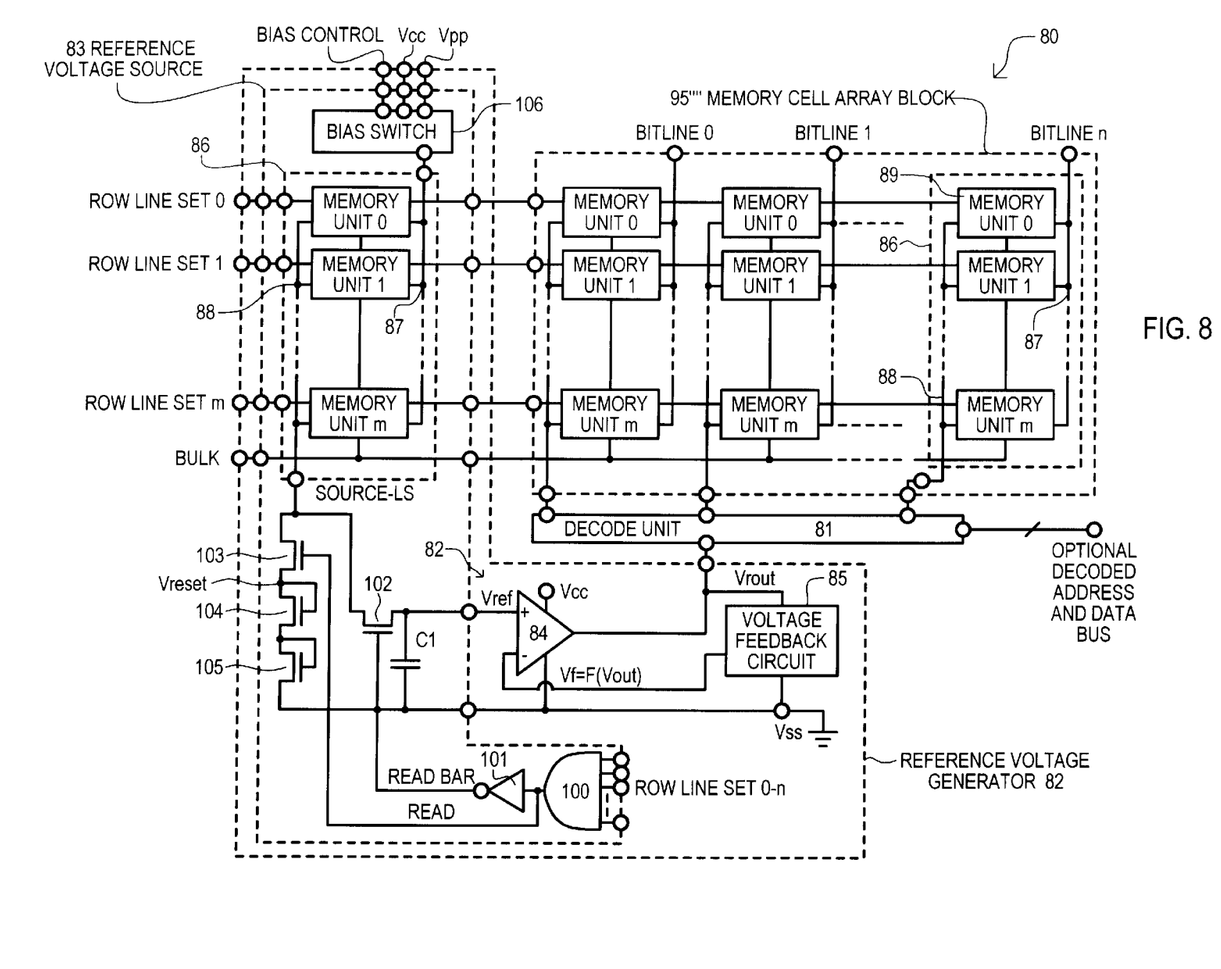
FIG. 8 is an electrical schematic diagram showing a non-volatile memory device which incorporates a reference voltage generator according to a preferred embodiment of the invention.

According to a preferred embodiment of the invention, a device is proposed that utilizes a novel reference voltage source which tracks variations that affect the leakage current of "off" cells within a memory array. As seen in FIG. 8, a circuit 80 includes a memory cell array block 95"" and a reference voltage generator 82. The block 95"" has at least one column 86, each column containing at least one memory unit 89. Each memory unit 89 within a column is connected to a high-side line 87 on one side and to a low-side line 88 on another side. Further, each memory unit 89 is controlled by a unique row line set, each row line set including at least one row line. Each memory unit 89 includes a contact to the bulk of the transistors included therein. Bulk contacts for each and every memory unit included in Block 95"" are tied in common to a bulk contact. When Block 95"" contains more than one column, row line sets control memory units included in adjacent columns along a row. Examples of different types of memory units 89 are described later, including examples of the functionality controlled by the row line sets. Each column high-side line 87 is connected to a unique bitline and each column low-side line 88 is connected to a decode unit 81.

By way of example, FIG. 8 shows a memory cell array containing n+1 columns and m+1 rows. The high-side line of Column 0 is connected to Bitline 0, the high-side line of Column 1 is connected to Bitline 1, and the high-side line of Column n is connected to Bitline n. The low-side lines of each and every column are connected to decode unit 81 which has at least Vrout, the output of generator 82, as an input. Optionally, decode unit 81 also has an optional decoded address and data bus as an input/output channel.

Decode unit 81 allows different applications of the output of generator 82 to the low-side lines 88 within block 95"". In its simplest form, decode unit 81 can simply be a hard-wired connection shorting all of the low-side lines 88 within block 95"" to the output of generator 82, Vrout. Otherwise, decode unit 81 is useful to selectively connect the output of generator 82 to low-side lines. When current is sensed on the low-side lines, rather than the bitlines, during a read operation, the decode unit 81 allows for selectively decoding low-side lines for data sensing. Another use of decode unit 81 results when the circuit 80 includes multiple copies of block 95"". In this case, decode unit 81 can selectively apply the output of generator 82 to specific copies of block 95"", and not to others.

Decode unit 81 also enables the output of generator 82 to be isolated from block 95"" during program and erase operations. For example, for the devices shown in FIG. 1 and FIG. 2 above, a program operation biases the lines 87 and 88 to either a negative write potential with respect to Vcc, or to a potential between Vcc and the negative write potential. It is helpful to disconnect the output of generator 82 from block 95"" during this operation to avoid excessive and unwanted current.

The generator 82 includes reference voltage source 83, differential amplifier 84 and voltage feedback circuit 85, configured to form a voltage generator that conforms to the circuit shown in FIG. 5. The source 83 contains at its heart, a copy of the column 86 included in block 95"". To increase the advantages of the invention, the column 86 included in the source 83 can be placed in a contiguous manner with the columns included in the block 95"".

The source 83 and block 95"" share row line sets within a common row. Row line set 0 controls the memory unit 0 of columns 86 within both block 95"" and source 83. Likewise, the row line set 1 controls the memory unit 1 of 86 within both block 95"" and source 83, and continuing on until row line set m controls memory unit m within columns 86 within both block 95"" and source 83. The bulk contacts for each and every memory unit included in block source 83 are tied in common to the bulk contact shared with block 95"".

Unlike the columns 86 within the block 95"", the high-side line 87 of the column 86 within source 83 is not connected to a bitline, but is connected to a power supply voltage by way of bias switch 106.

Source 83 also includes control circuitry that effects a clocked connection between low-side line 88 (source-LS) to the other circuitry within generator 82. Transistors 102 and 103 connect node source-LS alternately to either the non-inverting input to amplifier 84, Vref, or to the node Vreset, which provide a current sink at a voltage less than the expected Vr. In FIG. 8, a series of two diode configured transistors are used, although any number of other types of current sinks could be used, such as resistors, diodes, Zener diodes or more complex circuits. The operation and purpose of these clocked connections are described in more detail below.

The output of bias switch 106 is connected to high-side line 87 within source 83. Bias switch 106 enables selectively biasing line 87 to the power supply voltage, Vcc, the power supply reference potential, Vss or to a write voltage, Vpp. The purpose of this switch is to supply an appropriate bias to line 87 within source 83 during read and program operations. During a read operation, the output of bias switch 106 is set to Vcc. During an erase operation, the output of bias switch 106 is set to Vcc. During program operation, the output of bias switch 106 is either set to Vpp or Vcc, according to the application. These choices will be discussed below through example applications.

Figure 9:
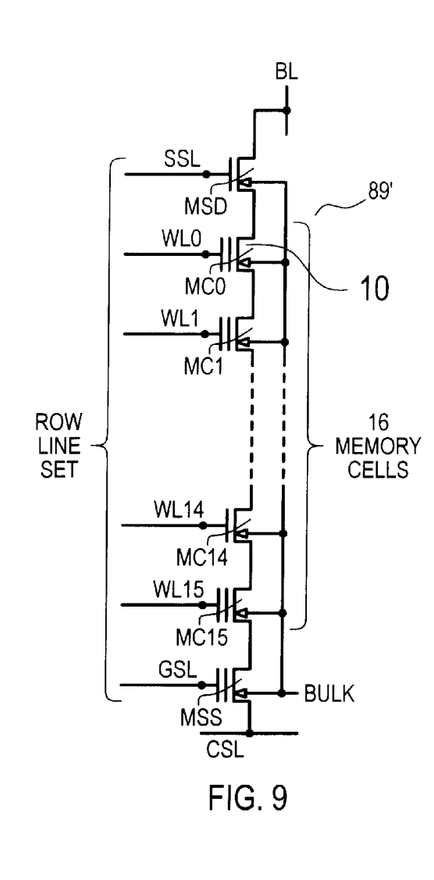
FIG. 9 an electrical schematic diagram showing the internal circuit arrangement of a NAND configured non-volatile memory according to a preferred embodiment of the invention.

FIG. 9 shows a schematic representation of a NAND stack memory unit 89' which can be placed in the memory unit 89 shown in FIG. 8. The memory unit 89' is connected at the top to a bit line, BL, and connected on the bottom to the common source line, CSL. When placed in memory unit 89 in FIG. 8, the CSL line is connected to the low-side line 88 and the drain connection of transistor MSD to BL is made to high-side line 87 of the column in which it resides. Further, the entire memory unit 89' resides within a common well connected to the bulk node in FIG. 8. Typically, the number of transistors 10 equals a power of two when used to store binary data in memory unit 89', and in FIG. 9 sixteen transistors, labeled MC0, MC1, through MC15, are shown as an example embodiment.

Memory transistor 10 is an insulated gate field effect transistor that includes a charge storage layer 32 embedded in its gate dielectric, as shown in FIG. 4. The charge storage layer 32 is typically surrounded by at least a top dielectric 31 and a bottom dielectric 33 and resides between the gate 12 and the channel 15 of the transistor. Channel 15 resides in the silicon bulk 11 between the source 14 and drain 16 regions. The charge storage layer 32 is either a "floating gate" of conductive material, typically of doped polycrystalline silicon, or a dielectric material such as silicon nitride, silicon oxynitride, silicon-rich silicon dioxide, or a ferroelectric material. A memory transistor 10 may store data as multiple states of information, including two states or four states.

The gates of transistors MC0, MC1, through MC15 are connected in common with gates of adjacent NAND stacks by way of word lines WL0, WL1, through WL15, respectively. Except for memory transistors MC0 and MC15, the drain and source of adjacent memory cells are connected together. The source of memory transistor MC0 is connected to the drain of the next memory cell down, memory transistor MC1. Also, the drain of memory transistor MC0 is connected to the source of select transistor MSD. The drain of transistor MSD is connected to a bit line (BL) and its gate is connected in common with gates in adjacent NAND stacks by the stack select line, SSL. The drain of memory transistor MC15 is connected to the source of the next memory cell above, memory transistor MC14. Also, the source of memory transistor MC15 is connected to the drain of select transistor MSS. The source of select transistor MSS is connected to the common reference line (CSL). The memory unit 89' also includes a selection transistor MSS whose gate is connected in common with adjacent NAND stacks within block 95"" by way of the global select line, GSL.

Collectively, lines GSL, SSL, WL0, WL1, through WL15 comprise the row line set that controls memory unit 89'. Alternately, memory unit 89' can be constructed as shown in FIG. 9, but without one or both of the select transistors, MSD and MSS, depending on the desired functionality and performance of a block 95"". In these cases, lines SSL and GSL are not included in the row line set when transistor MSD and MSS are eliminated from the memory unit, respectively.

Figure 10:
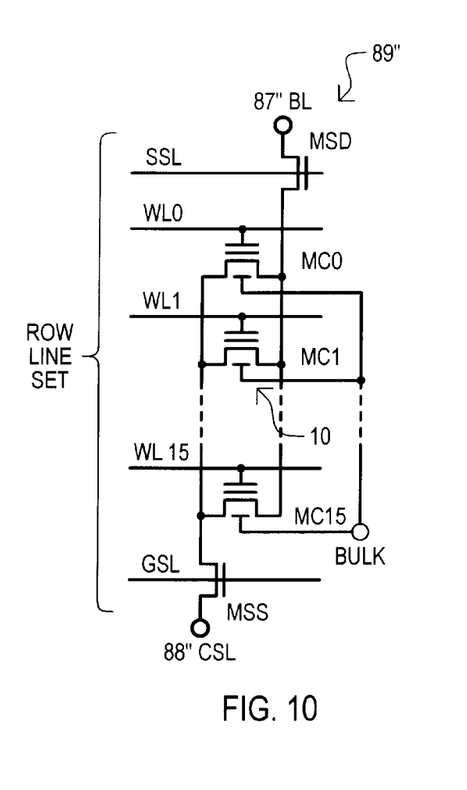
FIG. 10 is an electrical schematic diagram showing the internal circuit arrangement of an AND configured non-volatile memory according to a preferred embodiment of the invention.

FIG. 10 shows a schematic representation of an AND stack memory unit 89" which can be placed in the memory unit 89 shown in FIG. 8. The memory unit 89" is connected at the top to a bit line 87", BL, and connected on the bottom to the common source line 88", CSL. When placed in memory unit 89 in FIG. 8, the CSL line is connected to the low-side line 88 and the drain connection of transistor MSD to BL is made to high-side line 87 of the column in which it resides. Further, the entire memory unit 89" resides within a common well connected to the bulk node in FIG. 8. Typically, the number of transistors 10 equals a power of two when used to store binary data in memory unit 89", and in FIG. 10 sixteen transistors, labeled MC0, MC1, through MC15, are shown as an example embodiment.

Memory transistor 10 is an insulated gate field effect transistor that includes a charge storage layer 32 embedded in its gate dielectric, as shown in FIG. 4. The charge storage layer 32 is typically surrounded by at least a top dielectric 31 and a bottom dielectric 33 and resides between the gate 12 and the channel 15 of the transistor. Channel 15 resides in the silicon bulk 11 between the source 14 and drain 16 regions. The charge storage layer 32 is either a "floating gate" of conductive material, typically of doped polycrystalline silicon, or a dielectric material such as silicon nitride, silicon oxynitride, silicon-rich silicon dioxide, or a ferroelectric material. A memory transistor 10 may store data as multiple states of information, including two states or four states.

The gates of transistors MC0, MC1, through MC15 are connected in common with gates of adjacent AND stacks by way of word lines WL0, WL1, through WL15, respectively. The drain of each and every memory cell is connected to the source of transistor MSD, and the source of each and every memory cell is connected to the drain of transistor MSS. The drain of transistor MSD is connected to a bit line 87" (BL) and its gate is connected in common with gates in adjacent AND stacks by the stack select line, SSL. The source of select transistor MSS is connected to the node 88" which is a source for Vr. The memory unit 89" also includes a selection transistor MSS whose gate is connected in common with adjacent AND stacks within block 95" by way of the global select line, GSL.

Collectively, lines GSL, SSL, WL0, WL1, through WL15 comprise the row line set that controls memory unit 89". Alternately, memory unit 89" can be constructed as shown in FIG. 10, but without one or both of the select transistors, MSD and MSS, depending on the desired functionality and performance of a block 95"". In these cases, lines SSL and GSL are not included in the row line set when transistor MSD and MSS are eliminated from the memory unit, respectively.

Figure 11:
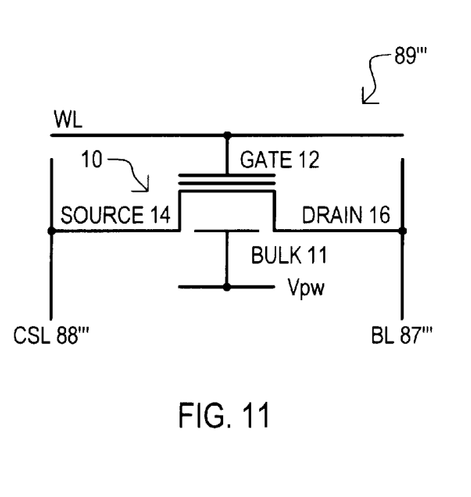
FIG. 11 is an electrical schematic diagram showing the internal circuit arrangement of a NOR configured non-volatile memory according to a preferred embodiment of the invention.

FIG. 11 shows a schematic representation of a NOR memory unit 89''' comprising a single memory transistor 10 which can be placed in the memory unit 89 shown in FIG. 8. The memory unit 89''' is connected at the drain 16 of transistor 10 to a bitline 87''' (BL) and connected at the source 14 of transistor 10 to the common source line 88''' (CSL). The gate 12 of transistor 10 is connected in common with other memory unit gates along a row by a wordline, WL. Further, the entire memory unit 89''' resides within a common well 11 connected to Vpw through the bulk node. When placed in unit 89 in FIG. 8, the bitline 87''' is connected to the high-side line 87 and the common source line 88''' is connected to low-side line 88 of the column in which it resides. The wordline, WL, comprises the row line set that controls the memory unit 89'''. Note that the memory unit 89''' shown in FIG. 11 can be thought of as a version of either memory unit 89' in FIG. 9 or memory unit 89" in FIG. 10, where there are no select devices and the number of memory transistors is equal to one.

Memory transistor 10 is an insulated gate field effect transistor which includes a charge storage layer 32 embedded in its gate dielectric, as shown in FIG. 4. The charge storage layer 32 is typically surrounded by at least a top dielectric 31 and a bottom dielectric 33 and resides between the gate 12 and the channel 15 of the transistor. Channel 15 resides in the silicon bulk 11 between the source 14 and drain 16 regions. The charge storage layer 32 is either a "floating gate" of conductive material, typically of doped polycrystalline silicon, or a dielectric material such as silicon nitride, silicon oxynitride, silicon-rich silicon dioxide, or a ferroelectric material. A memory transistor 10 may store data as multiple states of information, including two states or four states.

Figure 12:
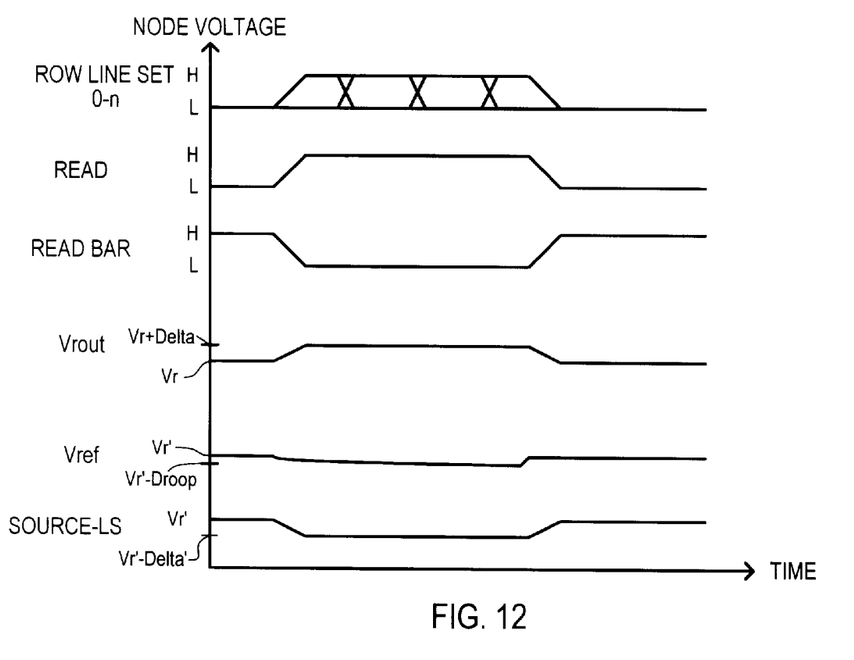
FIG. 12 illustrates the waveforms of main electrical signals appearing in the device of FIG. 8 during a read operation.

The operation of the generator 82 can now be described by referring to FIG. 8 and FIG. 12 together. For the purpose of this description, it is assumed that decode unit 81 acts to short at least one of the low-side line 88 to the output of generator 82 during a read operation. When no memory cells within the block 95"" are being read, all row line set lines are in a logic low state, typically equal to the power supply reference potential, Vss. During this time, logic signals Read and Read Bar are low and high, respectively. As a result source-LS is connected to node Vref by way of transistor 102.

Since there is no substantial current load on source-LS, the parasitic capacitance on node source-LS and the capacitor C1 will charge up toward Vcc until the leakage current passing through Memory Units 0 though m in Source 83 equals the parasitic leakage current seen by node Source-LS. By design this leakage current will be minimal and so the potential on source-LS is expected to equal a value that virtually shuts off conduction through the memory units in source 83. This value is designated as Vr'.

The transistor 102 virtually shorts source-LS to node Vref during this period, so the potential on Vref is expected to be substantially equal to the potential on source-LS, Vr'. At this point the output voltage of generator 82 is driven to Vr by the differential amplifier 84. When the voltage feedback circuit 85 is designed to generate exactly the output voltage of generator 82, the output voltage of generator 82 on node Vrout will be substantially equal to Vr', assuming minimal offset between the inverting and non-inverting inputs of differential amplifier 84. Alternately, an offset between source-LS and Vrout can be forced by designing the voltage feedback circuit 85 to generate the feedback voltage, Vf, the results in the desired offset, as is commonly known.

Once a read operation starts, at least one of the lines among all of the row line set will go high, sending the output of OR gate 100 high. At that time Read and Read Bar will switch to logic high and low levels, respectively. This serves to disconnect source-LS from node Vref and connect it to node Vreset.

The node Vref will now be floating at this time and is expected to deviate from Vr' by only a small amount during the read operation. FIG. 12 shows the potential on Vref changing from Vr' to Vr'-Droop, where by design, Droop is expected to be equal to zero to no more than a few millivolts in magnitude.

During the read, the node Vrout will be loaded by current flowing from Block 95"" and so the potential at Vrout is expected to deviate slightly from Vr. FIG. 12 shows Vrout changing from Vr to Vr+Delta, where Delta is expected to be zero or no more than a few tens of millivolts in magnitude. Since the non-inverting input to the differential amplifier 84 is still virtually at Vr' the differential amplifier 84 will, by design, provide enough current to maintain Vr on Vrout as closely as practical.

The transistor 103 virtually shorts Source-LS to node Vreset during this period. During a read, at least one of the memory units in 83 will be actuated by at least one of the lines within the row line sets. This will tend to raise source-LS unless a current drain is provided. The transistors provided between ground and node Vreset are designed to provide a current path from source-LS to ground so that the potential on source-LS falls rather than rises. The voltage on source-LS is expected to fall to Vr'-Delta', where Delta' is no more than a few tens of millivolts. Transistors 104 and 105 are chosen to help set this value near to, but less than, Vr'.

After the read operation is complete, all row line set lines return to a low logic state and source-LS is disconnected from node Vreset and reconnected to Vref via transistor 102. Once again, the potential on source-LS rises to Vr and the output of generator 82 is driven to Vr'.

The value of using such are generator 82 in circuit 80 is understood by examining the effects of variations on the "off" current of memory units within block 95"". The "off" current of memory units in block 95"" will vary with a number of factors, including but not limited to, variations in channel width, channel length, channel doping, gate dielectric thickness, the effects of cycling between opposite data states, temperature, and the level of Vcc. The column 86 included in source 83 can be incorporated in a contiguous manner with block 95"". When placed so, process induced variations that affect device geometry and doping in column 86 within block 95"" will likely affect the characteristics of column 86 within source 83 in the same manner. Likewise, the effects of variation in the power supply voltage Vcc will affect both the same.

Since memory units 89 are cycled at exactly the same time in both the source 83 and the block 95"", and in a similar manner, the cycling effects on "off" currents will be identical between the two. For optimal use of source 83, it is preferable to leave the memory units 89 within source 83 in the state that must be ensured off. For the memory unit 89' in FIG. 9, Vr must be sufficiently large to ensure that a selected programmed device is "off" when read. If each and every transistor 10 within memory units 89' within source 83 is left in the programmed state, then the potential on the node source-LS will rise to turn "off" these programmed transistors between reads. Thus, Vr will be sufficient to turn off programmed devices in memory unit 89' throughout block 95"".

For the memory unit 89" in FIG. 10, Vr must be sufficiently large to ensure that unselected erased devices are "off" when read. If each and every transistor 10 within memory units 89" within source 83 is left in the erased state, then the potential on the node source-LS will rise to turn "off" these erased transistors between reads. Again, Vr will be sufficient to turn off erased devices in memory unit 89" throughout block 95"". Likewise, Vr is optimally designed if memory units 89'" in FIG. 11 are left in the erased state.

Charge loss from charge storage layer 32 over the operating life of a device incorporating transistor 10 is similarly expected to affect the "off" current. Charge decay usually behaves in a monotonic fashion with time after it is stored in charge storage layer 32. Under steady conditions, typically the cumulative charge loss increases with time and also the rate of charge loss typically decreases with time. However, temperature and voltage bias also have an effect on the rate of charge loss. So changes in operating conditions of devices incorporating transistor 10 often result in changes in charge loss rates from charge storage layer 32, which can dramatically affect "off" current.

Such conditions, and changes in conditions, can vary widely with application and are at the discretion of the user, not the device designer. Therefore, in order for Vr to respond positively to these variation, the source 83 needs to track the effects these variations have on the characteristics of block 95"". To the degree that the charge loss rate from the charge storage layer 32 of transistors 10 are affected uniformly by variations within a local region, the charge loss characteristics of column 86 within source 83 and block 95"" are expected to be similar. Thus, the generator 82 is expected to control Vr in a manner that accommodates systematic variation in charge loss.

Likewise, if the charge stored in charge storage layer 32 is refreshed or changed in memory units 89 in block 95"", the charge in the memory units 89 in source 83 will simultaneously be refreshed since both share common wordlines and bulk nodes. During an erase operation, all transistors 10 within source 83 are erased. When incorporated in the devices of FIG. 1 and FIG. 2, the bulk node is biased at Vcc during an erase operation and the selected rows are biased at a write voltage, Vpp, of opposite polarity to the bulk in a manner that effects charge tunneling into charge storage layer 32.

During a program operation, all transistors 10 within source 83 will either be left in the programmed state or the erase state, depending on the application. For example, for the memory unit 89' shown in FIG. 9, it is preferable to leave all transistors 10 within source 83 in a programmed state. However, for the memory unit 89" shown in FIG. 10 and the memory unit 89'" shown in FIG. 11, it is preferable to leave all transistor 10 within source 83 in an erased state.

During programming, the selected wordlines are biased at Vcc and the bulk node is biased at a write voltage, Vpp, of opposite polarity. If the memory units within source 83 are to be left in the programmed state, line 87 in source 83 is biased to the write voltage, Vpp. Otherwise, tunneling is inhibited by placing a potential on the lines 87 that is either equal to Vcc or between Vcc and the write voltage, Vpp. In FIG. 8 for example, bias switch 106 provides Vpp to line 87 within source 83 to establish a programmed state and provides Vcc to inhibit programming to establish an erased state.

Thus the charge stored in charge storage layer 32 within source 83 is refreshed at the same time as the refresh or change of charge stored in transistors in block 95"". Further this refresh occurs on a row by row basis, so that Vr will automatically adjust for variations in "off" current leakage that result from differences in operation on a row by row basis. This further ensures that Vr tracks sources of variation in the characteristics of block 95"".

It is now apparent that a new and improved reference voltage generator can be designed that tracks the effects of variations on memory transistors within a non-volatile memory array. Further, it is also apparent that new and improved non-volatile memory devices can be constructed which provide better performance.

Other embodiments of the current invention can now follow by examining FIG. 1 and FIG. 2. In FIG. 1, the Memory block 95 can utilize the memory cell array block 95"" used in FIG. 8. With such a placement, memory unit 89 can comprise any number of memory cell configurations, such as those described by way of FIG. 3, FIG. 5, FIG. 9, FIG. 10 or FIG. 11. The reference generator 96 in FIG. 1 can be readily implemented by use of generator 82 shown in FIG. 8.

Likewise, in FIG. 2, the memory block 95' can utilize the Memory Cell Array Block 95"" used in FIG. 8. With such a placement, memory unit 89 can comprise any number of memory cell configurations, such as those described by way of FIG. 3, FIG. 5, FIG. 9, FIG. 10 or FIG. 11. The reference generator 267 in FIG. 2 can be readily implemented by use of generator 82 shown in FIG. 8. For the device shown in FIG. 2 the decode unit 81 of FIG. 8 would be implemented by elements 263 and 261 of FIG. 2.

Figure 13:
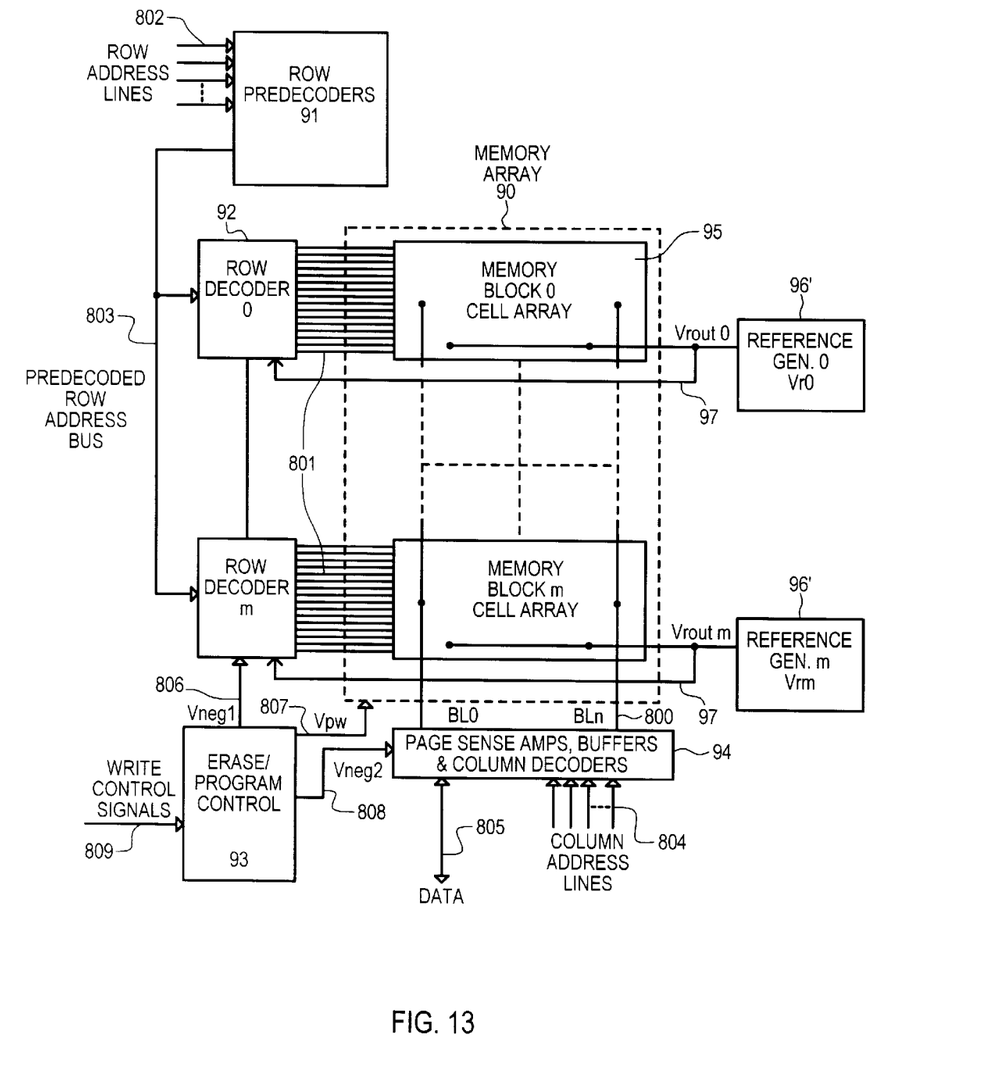
FIG. 13 shows a schematic representation of the overall circuit arrangement of a non-volatile memory device according to another embodiment of the invention in which one reference potential generator is provided for each of several memory blocks.

In addition, the device of FIG. 1 can be arranged such that each memory block 95 utilizes a unique and dedicated reference voltage generator 96'. Such an embodiment is shown in FIG. 13. The device shown in FIG. 13 is identical to that shown in FIG. 1 with the exception that there are m+1 reference voltage generator 96', rather than a single generator. Each generator 96' is the type shown in FIG. 8 as generator 82 and therefore, each generator 96' produces a different optimal Vr, depending on the conditions of the block 95 associated therewith. Block 0 is biased by a dedicated reference generator Vr 0. Likewise, block m is biased by a dedicated reference generator Vr m. Any number of blocks 95 with a dedicated reference generator 96' can be included. Each generator 96' also supplies Vr to an associated row decoder 92 by way of line 97.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

What is claimed is:

1. A semiconductor reference voltage source, comprising:
    a memory unit capable of storing information about a history of an associated circuit in proximity to said memory unit and containing at least some similar elements as said memory unit;
    said memory unit being connected to modify an output of said reference voltage source in accordance with said stored information; and
    a low-side line, a high-side line, means for biasing said high-side line, and means for generating an output potential on said low-side line, said memory unit having a low-side external node connected to said low-side line, a high-side external node connected to said high-side line, and an external control node connected to said select line.

2. The voltage source of claim 1 wherein said history includes information about at least some of states of stored information, construction variations of elements of the associated circuit, environmental considerations, deterioration and fatigue of circuit elements, and decay of information in the associated circuit.

3. The voltage source of claim 1 wherein said memory unit includes an integrated circuit memory cell for storing a unit of data.

4. The voltage source of claim 3 wherein said unit of data represents one of two possible states of information.

5. The voltage source of claim 3 wherein said unit of data represents one of four possible states of information.

6. The voltage source of claim 3 herein said memory cell comprises a non-volatile memory transistor.

7. The voltage source of claim 6 wherein said non-volatile memory transistor has a charge storage layer between at least portions of a gate and a channel, said charge storage layer comprising a material selected from the group including polycrystalline silicon, silicon nitride, silicon oxynitride, silicon-rich silicon dioxide, or a ferroelectric material.

8. The voltage source of claim 1 further comprising a plurality of substantially identical memory units and a corresponding plurality of row line sets, wherein each of said memory units is uniquely associated with one of said row line sets.

9. The voltage source of claim 3 wherein said memory unit comprises a NAND structure including a number of series-connected memory cells, means for selecting said NAND structure, and means for addressing each of said memory cells.

10. The voltage source of claim 9 wherein said number is a power of two.

11. The voltage source of claim 9 wherein said means to address said memory cells comprises a set of select lines, each connected to one of said memory cells.

12. The voltage source of claim 3 wherein said memory unit comprises an AND structure including a number of parallel-connected memory cells, means for selecting said AND structure, and means for addressing each of said memory cells.

13. The voltage source of claim 3 wherein said memory unit comprises a NOR structure including a plurality of memory cells and means for addressing each of said memory cells.

14. The voltage source of claim 1 wherein said means for biasing comprises an externally controlled circuit capable of selecting one of the supply potential, the supply reference and a write potential for application to said high-side line.

15. The voltage source of claim 1 further comprising an output node connected to said low-side line for presenting an output potential.

16. The voltage source of claim 1 further comprising means for isolating and maintaining said output potential including a circuit for connecting said low side line to either a reference voltage or to a voltage holding output circuit.

17. The voltage source of claim 16 wherein said reference voltage source comprises a circuit having a select transistor in series with elements selected from the group including resistors, diode configured transistors, diodes, Zener diodes, and circuits configured to provide a voltage that is substantially independent of current flow and of less magnitude than said output potential.

18. The voltage source of claim 16 wherein said voltage holding output circuit comprises a pass transistor connected in series with an output node in parallel with a capacitor.

19. A method of generating a reference voltage within an integrated memory circuit having a plurality of memory units arranged as an array of contiguous rows and columns, each of said memory units having external control nodes and external current nodes and comprising at least one memory cell capable of storing data, each row of said memory units being uniquely selectable by actuating a row line set connected to said control nodes of all the memory units associated therewith, and each column of said memory units having a high-side line and a low-side line, each line connected to one of said current nodes of all the memory units associated therewith, comprising:
    providing an additional column of said memory units, each memory unit having a unique row line set associated therewith; and
    isolating said low-side line of said additional column from substantial current sources or current sinks; and
    charging said low-side line of said additional column to said reference voltage; and
    providing the voltage on said low-side line of said additional column to an output node when said charging is substantially complete.

20. The method of claim 19 wherein said row line set comprises one select line.

21. The method of claim 19 wherein said row line set a number of row select lines, said number being equal to a non-negative integer power of two.

22. The method of claim 19 wherein said additional column is placed in a contiguous fashion with said array.

23. The method of claim 19 wherein said row line set associated with said memory units of said additional column is the same row line set associated with said array.

24. The method of claim 19 wherein said charging comprises passing a current from the high-side line of said additional column, through said memory units of said additional column to the low-side line of said additional column.

25. The method of claim 19 wherein said generation further comprises biasing said high-side line of said additional column to a high-side voltage.

26. The method of claim 25 wherein said high-side voltage is equal in polarity and greater in magnitude than said reference voltage.

27. The method of claim 19 wherein said generation further comprises biasing each of the row line set associated with the memory units of said additional column to establish a read pre-charge voltage condition.

28. The method of claim 27 wherein said read pre-charge voltage condition biases each of the row line set associated with said additional column to that set of biases that are used to deselect memory cells of a selected memory unit within said array while under read bias conditions.

29. The method of claim 27 wherein said read pre-charge voltage condition biases each of the row line set associated with said additional column to that set of biases that are used to select memory cells of a selected memory unit within said array while under read bias conditions.

30. An integrated memory circuit capable of generating a reference voltage comprising:
   a plurality of memory units arranged as an array in contiguous rows and columns, each memory unit having at least one memory cell capable of storing a unit of data; and
   external control nodes and external current nodes extending from each of said memory units; and
   a plurality of row line sets oriented substantially parallel to said rows; and
   a plurality of high-side lines oriented substantially parallel to said columns; and
   a plurality of low-side lines oriented substantially parallel to said columns; and
   a reference voltage source comprising an additional column of said memory units, a reference high-side line and a reference low-side line, and each memory unit having a unique row line set associated therewith.

31. The method of claim 30 wherein said row line set comprises one select line.

32. The method of claim 30 wherein said row line set comprises a number of row select lines, said number being equal to a non-negative integer power of two.

33. The circuit of claim 30 wherein said row line set associated with said memory units of said additional column is the same row line set associated with said array.

34. The circuit of claim 33 wherein said additional column is placed in a contiguous fashion with said array.

35. The circuit of claim 31 wherein said unit of data represents one of two possible states of information.

36. The circuit of claim 30 wherein said unit of data represents one of four possible states of information.

37. The circuit of claim 30 wherein said memory cell comprises a non-volatile memory transistor having an electrically alterable threshold voltage, said non-volatile memory transistor having a source, a gate, a drain, and channel region between said source and said drain, and a charge storage layer between at least portions of said gate and said channel.

38. The circuit of claim 37 wherein said charge storage layer comprises material selected from the group including polycrystalline silicon, silicon nitride, silicon oxynitride, silicon-rich silicon dioxide or a ferroelectric material.

39. The circuit of claim 30 wherein each row line set is uniquely associated with one row of said memory units, and connected to said control nodes of all the memory units associated therewith.

40. The circuit of claim 30 wherein each high-side line is uniquely associated with one column of said memory units, and connected to a first one of said current nodes of all the memory units associated therewith.

41. The circuit of claim 30 wherein each low-side line is uniquely associated with one column of said memory units, and connected to a second one of said current nodes of all the memory units associated therewith.

42. The circuit of claim 30 wherein said memory unit comprises a NAND structure, said NAND structure comprising a number of series-connected said memory cell with means to select said NAND structure and means to address each of said memory cell.

43. The circuit of claim 42 wherein said number is of a value equal to a non-negative integer power of two.

44. The circuit of claim 42 wherein means to address each of said memory cell comprises a set of row lines, each connected to one of said memory cell.

45. The circuit of claim 30 wherein said memory unit comprises an AND structure, said AND structure comprising a number of parallel-connected said memory cell with means to select said AND structure and means to address each of said memory cell.

46. The circuit of claim 30 wherein said memory unit comprises a NOR structure, said NOR structure comprising said memory cell with means to address each of said memory cell.

47. The circuit of claim 30 wherein said circuit further comprises means of biasing said reference high-side line.

48. The circuit of claim 47 wherein said means of biasing comprises an externally controlled circuit capable of selecting one of the supply potential, the supply reference and a write potential for application to said reference high-side line.

49. The circuit of claim 30 wherein said circuit further comprises means of presenting said reference voltage to an output node connected to said reference low-side line.

50. The circuit of claim 30 wherein said circuit further comprises means of isolating and maintaining said reference voltage by providing a controlled circuit capable of connecting said reference low-side line to either a voltage source or to a voltage holding output circuit.

51. The circuit of claim 50 wherein said voltage source comprises a circuit having a select transistor in series with elements selected from the group including resistors, diode configured transistors, diodes, Zener diodes, and circuits configured to provide a voltage that is substantially independent of current flow and of less magnitude than said output potential.

52. The circuit of claim 50 wherein said voltage holding output circuit comprises a pass transistor connected in series with an output node in parallel with a capacitor.

* * * * *